US006475928B1

(12) United States Patent
Berenguer et al.

(10) Patent No.: US 6,475,928 B1
(45) Date of Patent: *Nov. 5, 2002

(54) PROCESS FOR DEPOSITING A $TA_2O_5$ DIELECTRIC LAYER

(75) Inventors: Marc Berenguer, Revel; Roderick Devine, Saint Martin le Vinoux, both of (FR)

(73) Assignee: France Telecom, Paris (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/115,706

(22) Filed: Jul. 15, 1998

(30) Foreign Application Priority Data

Jul. 15, 1997 (FR) .............................. 97 08955

(51) Int. Cl.[7] .............................. C23C 16/40
(52) U.S. Cl. ................ 438/776; 438/785; 438/792; 427/534; 427/535; 427/576; 427/579; 427/255.27; 427/255.29
(58) Field of Search ................ 427/534, 535, 427/576, 579, 255.27, 255.29; 438/776, 785, 792

(56) References Cited

U.S. PATENT DOCUMENTS

| 4,708,904 A | * | 11/1987 | Shimizu et al. |
| 4,891,684 A | | 1/1990 | Nishioka et al. ............... 357/51 |
| 5,352,623 A | * | 10/1994 | Kamiyama .................. 438/396 |
| 5,827,773 A | * | 10/1998 | Voutsas |

FOREIGN PATENT DOCUMENTS

JP 04223366 * 8/1992

OTHER PUBLICATIONS

Kishimoto et al., Japanese Journal of Applied Physics, vol. 29, No. 10, pp. 2273–2276. Oct. 1990.*
Chemical Abstract 99:205087 of Gicquel et al., Proc.–Electrochem. Soc., (1983), 83–10, (Proc. Symp. Plasma Process., 4th), pp 169–79. (no month).*
59 078553 A Patent Abstracts of Japan published Jul. 5, 1984, Hitachi Ltd., 1 sheet.
XP 000553893 Sun, et al, "Characterization of Rapid Thermal Annealing of LPCVI $Ta_2O_5$ films in Nitric Oxide Ambient," 1056b Extended Abstract fall Metting Oct. 8/13, St. Louis, Missouri, pp. 870–871.
Search Report of Institut National de la Propriete Indusrielle for FR 9708955 dated Mar. 19, 1998.

* cited by examiner

Primary Examiner—Timothy Meeks

(57) ABSTRACT

The process comprises the following steps:
  a) pretreatment of a surface of the substrate by means of a cold gas plasma at low or medium pressure in order to clean the said surface;
  b) growth, from the said cleaned surface of the substrate, of a nitride barrier layer by means of a cold gas plasma made up of an $N_2/H_2$ mixture at low or medium pressure; and
  c) deposition, on the nitride barrier layer, of a $Ta_2O_5$ dielectric layer by chemical vapor deposition (CVD) or plasma enhanced chemical vapor deposition (PECVD).

5 Claims, No Drawings

PROCESS FOR DEPOSITING A TA$_2$O$_5$ DIELECTRIC LAYER

The present invention relates in general to a process for depositing a dielectric layer such as Ta$_2$O$_5$ on a substrate capable of being nitrided.

The increase in the integration density and the speed of electronic circuits is leading to a regular reduction in the size of the components such as elementary transistors. Because of this, the advance in fabrication technology is in particular characterized by a decrease in the thickness of some of the materials which are used, in particular the gate dielectric material for the transistors, permitting greater integration.

For this reason, it has been envisaged to replace the dielectric material conventionally used, SiO$_2$, by materials with better performance. One of the materials adopted is tantalum pentoxide Ta$_2$O$_5$, because it has a higher electric permitivity than silicon oxide.

Ta$_2$O$_5$ is conventionally deposited by chemical vapour deposition (CVD) or plasma enhanced chemical vapour deposition (PECVD). The quality of the deposit depends on the surface condition of the substrate and, in particular, its surface energy which should, as far as possible, be predetermined, constant and reproducible. Furthermore, it is necessary to carry out a heat treatment of the deposited layer in order to repair the defects induced during fabrication. These treatments, generally oxidizing treatments, may greatly reduce the electric permitivity of the deposited layer owing to the diffusion of the species through the dielectric.

The process herein described relates to a process for depositing a Ta$_2$O$_5$ dielectric layer which overcomes the drawbacks of known processes.

In one embodiment, a process has been developed for depositing a Ta$_2$O$_5$ dielectric layer on a substrate capable of being nitrided, which includes the following steps:

pretreatment of a surface of the substrate by means of a cold gas plasma at low or medium pressure in order to clean the said surface;

growth, from the said cleaned surface of the substrate, of a nitride barrier layer by means of a cold gas plasma made up of an N$_2$/H$_2$ mixture at low or medium pressure; and deposition, on the nitride barrier layer, of a Ta$_2$O$_5$ dielectric layer by chemical vapour deposition (CVD) or plasma enhanced chemical vapour deposition (PECVD).

The term cold plasma used in this patent application denotes non-equilibrium plasmas which have little energy transfer by atom/electron collisions and therefore include cold atoms (or radicals) as opposed to hot plasmas (stellar plasmas or thermonuclear fusion plasmas). These low-collision plasmas whose electronic temperature is of the order of a few electron volts are furthermore out of local thermodynamic equilibrium. The plasmas used for various treatments in microelectronics (etching, deposition, cleaning, etc.), and even more generally for the surface treatment of materials, are always of the "cold plasma" type as defined above.

The expression $n_e > 10^{11} cm^{-3}$ refers only to the electron density. Nevertheless, the parameter $n_e$ is quite clearly decisive for the creation of active species in the plasma. The criterion $n_e > 10^{11} cm^{-3}$ therefore corresponds to a very high-density plasma leading to the production of a large concentration of these species, allowing effective surface treatment in a very short time. However, the value of $n_e$ is not in fact very critical, and it is perfectly possible to carry out treatments of this type with plasmas having a lower electron density, $n_e \ll 10^{11} cm^{-3}$, if it is acceptable to use processes which last longer (for example collective sample treatment in a batch reactor).

The operating pressure range for plasma treatment processes is directly linked with the type of plasma reactor (source) which is used. Several types of reactors which operate with different pressure intervals may be suitable for this application. These pressure intervals do not differ significantly from those of processes (deposition, etching) for which the reactors are usually designed. An example of a reactor which operates at "medium pressure" (50–1000 mtorr) is given by the RF diode type (PECVD oxide deposition). The most recent generation plasma sources (ECR, DECR, inductive coupling helicon, etc.), used both for deposition and for etching constitute examples of systems which operate at "low pressure" (typically 0.5–10 mtorr).

The substrates to which the process applies are any substrates which are composed of a material capable of being nitrided, that is to say able to form a nitride, such as semi-conductor materials like Si, SiO$_2$ and Ge$_x$Si$_{1-x}$ (0<x≦1), conductive materials like metals, for example Ti, W, Al and Cu, or alternatively polymers having polar groups.

The preferred materials for the substrates which can be used in the process are semi-conductor materials and, in particular, Si, SiO$_2$ and Ge$_x$Si$_{1-x}$.

The first step in the process is a step of pretreating a surface of the substrate by means of a cold gas plasma at low or medium pressure in order to clean the surface of its impurities, for example the native oxide in the case of a silicon substrate, without inducing significant surface irregularities. The gas plasmas preferably used are plasmas made up of hydrogen, mixtures of hydrogen and argon, and oxygen. The particularly recommended plasmas are hydrogen plasmas. Oxygen plasmas are used for cleaning substrates which have a hydrocarbon surface or a surface which is highly contaminated, for example with oils.

Pretreatments for cleaning the surfaces of substrates using a plasma are known per se.

Preferably, this pretreatment step is carried out at a temperature below 300° C., and even better at room temperature. The pressure is generally between $10^{-4}$ and 1 torr, preferably between $10^{-3}$ and $10^{-2}$ torr.

The plasma density $n_e$ is $10^{10} cm^{-3}$ or more, and preferably $\geq 10^{11} cm^{-3}$, in order to shorten the pretreatment time.

This pretreatment step generally lasts between 1 second and 1 minute, and is preferably of the order of 30 seconds, in order to avoid the formation of significant roughness in the surface.

This plasma pretreatment should provide a low ion bombardment energy so as not to create defects in the surface which is treated. This is why the pretreatment is preferably carried out with a difference between the potential of the plasma and the floating potential, $V_p - V_f < 20$ V.

The second step of the process includes a step of growing a nitride barrier layer from the pretreated surface of the substrate, in which step the material of the substrate contributes to the formation of the nitride barrier layer.

This growth step is carried out by using a cold plasma at low or medium pressure, made up of an N$_2$/H$_2$ mixture, preferably a high-density plasma. This step of growing the nitride barrier layer is generally carried out at a temperature below 300° C., preferably at room temperature. The nitrogen and hydrogen delivery rates are generally in an N$_2$/H$_2$ ratio of about 1.5/1 to 4/1, preferably of the order of 2/1.

This growth step generally lasts between 5 and 15 minutes, preferably 7 to 10 minutes.

Thus, in the case of a silicon substrate, a barrier layer made up of silicon nitride $Si_3N_4$ is formed in this growth step.

The growth of this silicon nitride layer naturally saturates at a thickness of 3 nm (measured by ellipsometry, index n fixed at 3) by stopping diffusion of the reactive species through the layer. This is due essentially to the fact that use is made of plasmas with low ion bombardment energy ($V_p$-$V_f$<20 V) and with little thermal assistance.

The nitride barrier layer, which modifies the surface bonds of the substrate, leads to an increase in the polar part of the surface energy. This nitride barrier layer has a stabilized, uniform and reproducible surface energy, which guarantees control over the subsequent deposition of $Ta_2O_5$ and improves the adhesion of the $Ta_2O_5$ deposit. Lastly, this nitride barrier layer prevents oxidation of the underlying layers during subsequent treatments, such as annealing operations, for example after the $Ta_2O_5$ layer has been deposited.

In the case of an $Si_3N_4$ barrier layer, this layer was characterized by measuring its thickness using ellipsometry.

The non-polar and polar parts of the surface energy were also measured using the method consisting in measuring the contact angle of a liquid drop with the surface of the barrier layer. By measuring the contact angle of a drop of diiodomethane, the non-polar component of the surface energy is determined, the value of which is directly linked with the chemical nature of the surface. Measuring the contact angle of a drop of water characterizes the polar component of the surface energy.

One commercially available instrument for measuring the contact angles is the G2/G40 instrument from the company KRÜSS.

EXAMPLE

In a DECR reactor with magnetic confinement, a $Ta_2O_5$ deposit was formed on a silicon substrate by using the process of the invention.

The treatment and deposition conditions are indicated in the following table.

|  | $H_2$ delivery rate (cm³/minute) | | Time (minutes) | | P (microwave (w)) |
|---|---|---|---|---|---|
| Pretreatment | 25 | | 1.5 | | 750 |

|  | $H_2$ delivery rate (cm³/minute) | $H_2$ delivery rate (cm³/minute) | Time (minutes) | | P (microwave (w)) |
|---|---|---|---|---|---|
| Growth of the $Si_3N_4$ barrier layer | 10 | 18.8 | 10 | | 750 |

|  | Pressure ($H_2 + O_2$) (mtorr) | Pressure ($H_2 + O_2$ + $TaF_5$) (mtorr) | Time (minutes) | Substrate temperature (° C.) | P (microwave (w)) |
|---|---|---|---|---|---|
| PECVD of the $Ta_2O_5$ layer | 2.120 | 2.180 | 10 | 50 | 750 |

Solid $TaF_5$ is used as a source, and the pretreatment and growth steps are carried out at room temperature.

The $Ta_2O_5$ layer which is obtained has a thickness of 38.8 nm and an index of 2.14.

Characterization of the $Si_3N_4$ barrier layer.

For this layer, an equivalent thickness of 2 nm at a fixed index of 2 is measured because the thickness is too small for the measuring instrument to determine its index.

The non-polar and polar components of the surface energy are measured by the drop method, and the results which are obtained are compared with those for a reference silicon nitride layer.

The results are given in the following table.

|  | Reference | Sample |
|---|---|---|
| Diiodomethane angle | 34 | 34 |
| $H_2O$ angle | 38 | 10 |

The value of the contact angle with diiodomethane guarantees that the barrier layer is indeed silicon nitride.

The value of the contact angle with water, which characterizes the polar component of the surface energy, shows that this value is very high, and consequently the $Ta_2O_5$ deposit will have a great affinity to bond with the barrier layer, thus creating a combination with good cohesion. Furthermore, these values guarantee that the deposit is reproducible.

AUGER spectroscopy and XPS confirmed that the barrier layer was indeed a stoichiometric compound of silicon and nitrogen ($Si_3N_4$).

In order to confirm that this layer forms an effective barrier, a heat treatment under an oxygen atmosphere was carried out on a sample which, on a silicon substrate, included a barrier layer according to the process of the invention and a $Ta_2O_5$ layer, as well as a reference sample which did not have a barrier layer. After 70 minutes at 900° C. under an oxygen atmosphere at atmospheric pressure, a 20 nm layer of $SiO_2$ was obtained on the reference sample, and no modification was obtained on the sample which had the barrier layer according to the invention.

The entire sample (nitride barrier layer+dielectric layer) was characterized by AUGER spectroscopy and conventional electrical measurements of capacitance (C(V)) and current (I(V)).

The process is particularly suited to the fabrication of transistors by replacing the conventional steps of producing the silicon oxide constituting the transistor gates.

The process may also advantageously be used for the fabrication of non-volatile memories. In this case, the pretreatment and growth steps will have the effect of creating a silicon nitride layer on a floating gate made of polycrystalline silicon on a silicon oxide, and the step of depositing $Ta_2O_5$ will form a dielectric layer. This strongly dielectric layer will have the effect of lowering the electrical potential needed for writing to the memory. As for the $Si_3N_4$ layer, it will ensure better retention of the information which is stored, by reducing the electrical charge leakage through the $Ta_2O_5$ layer.

Finally, the process is also advantageously used for the fabrication of memory capacitors of DRAM structures, high-value dielectric capacitances for integrated circuits, such as capacitors, and capacitors for supply decoupling or for filtering.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A process for depositing a tantalum oxide ($Ta_2O_5$) dielectric layer upon a semiconductor substrate, comprising:

pre-treating a surface of the semiconductor substrate by means of a cold gas plasma carried out at a temperate of about room temperature and at a low or medium pressure between $10^{-4}$ and 1 torr during the pretreatment of the surface;

growing a nitride barrier layer upon the semiconductor substrate by means of a cold gas plasma comprising a mixture of hydrogen and nitrogen carried out at a temperature of about room temperature and at a low or medium pressure between $10^{-3}$ and $10^{-2}$ torr during the growth of the nitride barrier; and depositing a tantalum oxide layer upon the nitride barrier layer by means of chemical vapor deposition (CVD) or plasma enhanced chemical vapor deposition (PECVD); and wherein the semiconductor substrate comprises titanium, tungsten, aluminum, or copper.

2. The process according to claim 1, wherein the tantalum oxide dielectric layer constitutes the dielectric layer of a transistor gate, of a non-volatile memory structure, of a capacitor of a DRAM memory, or of a decoupling or filtering capacitor of an integrated circuit.

3. The process of claim 1, wherein the cold gas plasma in the pretreatment step comprises hydrogen.

4. The process of claim 1, wherein the cold gas plasma in the pretreatment step comprises a mixture of hydrogen and argon.

5. The process of claim 1, wherein the cold gas plasma in the pretreatment step comprises oxygen.

* * * * *

UNITED STATES PATENT AND TRADEMARK OFFICE
CERTIFICATE OF CORRECTION

PATENT NO.     : 6,475,928 B1
DATED          : November 5, 2002
INVENTOR(S)    : Berenguer et al.

It is certified that error appears in the above-identified patent and that said Letters Patent is hereby corrected as shown below:

<u>Column 5,</u>
Line 15, please delete "temperate" and substitute therefor -- "temperature" --.

Signed and Sealed this

Fifth Day of August, 2003

JAMES E. ROGAN
*Director of the United States Patent and Trademark Office*